United States Patent
Dai et al.

(10) Patent No.: US 12,322,929 B1
(45) Date of Patent: Jun. 3, 2025

(54) HIGH-POWER LARGE-APERTURE FUNDAMENTAL MODE VORTEX OPTICAL WAVEGUIDE COHERENT VCSEL ARRAY

(71) Applicant: Beijing University of Technology, Beijing (CN)

(72) Inventors: Jingjing Dai, Beijing (CN); Jianjun Luo, Beijing (CN); Zhiyong Wang, Beijing (CN); Wei Li, Beijing (CN)

(73) Assignee: Beijing University of Technology, Beijing (CN)

( * ) Notice: Subject to any disclaimer, the term of this patent is extended or adjusted under 35 U.S.C. 154(b) by 0 days.

(21) Appl. No.: 18/884,137

(22) Filed: Sep. 13, 2024

(51) Int. Cl.
  *H01S 5/183* (2006.01)
  *H01S 5/026* (2006.01)
  *H01S 5/42* (2006.01)

(52) U.S. Cl.
  CPC ............ *H01S 5/423* (2013.01); *H01S 5/026* (2013.01); *H01S 5/18394* (2013.01)

(58) Field of Classification Search
  CPC ....... H01S 5/423; H01S 5/026; H01S 5/18394
  See application file for complete search history.

(56) References Cited

U.S. PATENT DOCUMENTS

| | | | | |
|---|---|---|---|---|
| 2006/0093008 A1* | 5/2006 | Mochizuki | ............ | B82Y 20/00 372/50.23 |
| 2007/0201528 A1* | 8/2007 | Nagatomo | .......... | H01S 5/18319 372/102 |
| 2017/0346257 A1* | 11/2017 | Garnache-Creuillot | ..................... H01S 5/18319 | |

FOREIGN PATENT DOCUMENTS

| | | | | |
|---|---|---|---|---|
| CN | 201435526 Y | 3/2010 | | |
| CN | 106654857 A | 5/2017 | | |
| CN | 114300939 A | * 4/2022 | ............ | H01S 5/183 |
| CN | 114400499 A | 4/2022 | | |
| CN | 115189227 A | 10/2022 | | |
| WO | 2022011910 A1 | 1/2022 | | |

OTHER PUBLICATIONS

Zhou Guang-Zheng, et al., Design and simulation of integration of vertical cavity surface emitting lasers and heterojunction bipolar transistor, Acta Phys. Sin., 2019, pp. 1-7, vol. 68 No. 20.

* cited by examiner

*Primary Examiner* — Yuanda Zhang
(74) *Attorney, Agent, or Firm* — Bayramoglu Law Offices LLC

(57) ABSTRACT

A high-power large-aperture fundamental mode vortex optical waveguide coherent VCSEL array is provided, and the coherent VCSEL array is a large-aperture array light-emitting structure, including an N electrode layer, an N-type DBR, an active region, an P-type DBR and a P electrode layer; micro/nanostructures pores with hexagonal lattice arrangement are etched on the surface of light output aperture on the each light-emitting unit mesa of the coherent VCSEL array, the micro/nanostructures pores are filled with highly doped semiconductor transparent materials to form a vortex optical waveguide structure. The provided combines the vortex optical waveguide structure and the P electrode layer in the traditional VCSEL array laser to realize the transverse and longitudinal regulation of the optical waveguide, the transverse and longitudinal injection of the current and the transverse and longitudinal conduction of the heat, and finally realizes the large-aperture high-power and high-coherence fundamental mode VCSEL array.

8 Claims, 5 Drawing Sheets

HIGH-POWER LARGE-APERTURE FUNDAMENTAL MODE VORTEX OPTICAL WAVEGUIDE COHERENT VCSEL ARRAY

CROSS REFERENCE TO THE RELATED APPLICATIONS

This application is based upon and claims priority to Chinese Patent Application No. 202311653123.0, filed on Dec. 5, 2023, the entire contents of which are incorporated herein by reference.

TECHNICAL FIELD

The present invention relates to the field of semiconductor laser technology, and specifically relates to a high-power large-aperture fundamental mode vortex optical waveguide coherent vertical-cavity surface-emitting laser (VCSEL) array.

BACKGROUND

With the wide application of high-power semiconductor lasers in optical pumping, medical treatment, material processing, free space communication, and other fields, high-power VCSEL stands out for its excellent coherence and single longitudinal mode output. There are two ways to improve the power of VCSEL: enlarging the optical aperture of VCSEL or arraying semiconductor lasers; however, due to the characteristics of VCSEL, increasing the optical aperture will cause the optical constraint to be weakened; increasing the laser array unit is difficult to achieve high-coherent laser; the electric resistance and thermal resistance of the device at high-power operation will also greatly affect the device performance. Therefore, the realization of stable laser output with high-coherence and high-power of VCSEL lasers has become an urgent problem to be solved.

SUMMARY

Aiming at the shortcomings of the existing technology, the present invention provides a high-power large-aperture fundamental mode vortex optical waveguide coherent VCSEL array, by using the vortex optical waveguide structure in a hexagonal lattice arrangement, the problems of large-aperture light-emitting unit VCSEL array with optical constraint weakening, low output laser power and poor coherence are solved, and a high-order Laguerre-Gaussian beam modulation of a single transverse laser and a formation of an optical interconnection and a longitudinal output of fundamental-mode high-power coherent light by VCSEL array optical waveguides are realized; by injecting highly doped semiconductor transparent material into the vortex optical waveguide structure to change an equivalent refractive index of the structure, the mode conversion and modulation of the Laguerre-Gaussian beam are carried out, thereby generating a vortex beam; by using the highly doped semiconductor transparent material as a P electrode, the enhancement of the P electrode area is realized, therefore, the problem that the large current is difficult to transmit during the operation of the array is solved, at the same time, by injecting the highly doped semiconductor transparent material into the vortex optical waveguide structure can also directly over the P-type distributed Bragg reflector (DBR) region with high electric resistance to directly introduced the current into an active region, the current injection efficiency is improved due to reduce the P-type DBR electric resistance of the device, and a large amount of Joule heat generated by the current passing through the P-type DBR is reduced; by injecting highly doped semiconductor transparent materials into the vortex optical waveguide structure, the device has excellent thermal conductivity, which can directly export the heat generated in the active region, reduce the influence of poor thermal conductivity of the P-type DBR layer, and reduce the overall thermal resistance of the device, thereby improving the heat dissipation performance of the device; the high-power fundamental mode laser output of VCSEL array is realized.

The present invention discloses a high-power large-aperture fundamental mode vortex optical waveguide coherent VCSEL array, being a large-aperture array light-emitting structure and including an N electrode layer, an N-type DBR, an active region, a P-type DBR, and a P electrode layer; micro/nanostructures pores with a hexagonal lattice arrangement are etched on a surface of a light output aperture on each light-emitting unit mesa of the coherent VCSEL array, the micro/nanostructures pores are filled with highly doped semiconductor transparent materials to form a vortex optical waveguide structure, that is, the fundamental mode vortex optical waveguide photonic band gap structure; wherein, the vortex optical waveguide structure is a periodically etched optical micro/nanostructures with a Laguerre-Gaussian laser transverse optical field modulation, which can convert a Laguerre-Gaussian beam to produce a series of vortex eigenmodes, these appropriate vortex eigenmodes are selected for combination and superposition to form a vortex beam;

The vortex optical waveguide structure can convert the beam mode of a high-order Laguerre-Gaussian laser emitted by a single large-aperture VCSEL. In a vertical array direction, the high-order Laguerre-Gaussian beam emitted from each light-emitting aperture converts the high-order mode into the vortex beam with near-diffraction-limit beam quality through the surrounding vortex waveguide structure; through the vortex optical waveguide structure in an array plane, a transverse optical field light between an adjacent light-emitting units in the array can be exchanged, all the light-emitting units make the two-dimensional VCSEL array form an optical interconnection through the vortex optical waveguide structure, and become an integral coherent emitting high-power large-aperture fundamental mode VCSEL array.

As a further improvement of the present invention, the micro/nanostructures pores with the hexagonal lattice arrangement are etched on a mesa surface and under a mesa surface of each light-emitting unit of the coherent VCSEL array, the micro/nanostructures pores are filled with the highly doped semiconductor transparent materials to form the vortex optical waveguide structure.

As a further improvement of the present invention, micro/nanostructures pores of an inner ring on the mesa and micro/nanostructures pores of an outer ring under the mesa are coaxially arranged with the light output aperture of the light-emitting unit, and an etching depth of the micro/nanostructures pores of the inner ring is greater than an etching depth of the micro/nanostructures pores of the outer ring.

As a further improvement of the present invention, an arrangement of the light-emitting units of the coherent VCSEL array includes one of a hexagonal array arrangement, a square array arrangement, and a ring array arrangement.

As a further improvement of the present invention, the highly doped semiconductor transparent material of the vortex optical waveguide structure has a high selective transmittance for a near-infrared wavelength light emitted by the coherent VCSEL array, and composition and density of the highly doped semiconductor transparent material are allowed to be adjusted according to actual needs to form an internal and external refractive index difference.

As a further improvement of the present invention, the highly doped semiconductor transparent material exists on the surface of a light output area of the VCSEL array and forms a P electrode contact with the array, with the help of this material instead of a traditional P electrode, the P electrode can be made on a whole light output surface of the VCSEL array, and a conductive area of a P side of the VCSEL array is increased in multiples, so that it can load more current to transmit laterally on the VCSEL array.

As a further improvement of the present invention, the highly doped semiconductor transparent material is also injected into the hole of the etched vortex optical waveguide micro/nanostructures and forms a predetermined electrical contact with a P side electrode, the highly doped semiconductor transparent material in the pore of the vortex optical waveguide structure can realize that the current directly supplies current to an active region over the P-DBR with high electric resistance longitudinally, and a logarithm of the P-DBR through which the actual current passes is reduced, so that the influence of the P-type DBR with high resistance on the current is also reduced, the total resistance of the whole array is also reduced, and the Joule heat generated inside the device is also reduced.

As a further improvement of the present invention, through the combination of highly doped semiconductor transparent material and vortex optical waveguide structure, a special channel for current transmission is formed, which realizes high-efficiency current transmission with a large area in a transverse direction and high-efficiency current injection in a vertical direction, which reduces the heat-generating capacity of the device and improves the photoelectric conversion efficiency of the array.

As a further improvement of the present invention, the highly doped semiconductor transparent material can adjust a material composition ratio, and change the chemical composition and density of the material, so that the material has a selective optical absorption and optical transmission capability, thereby achieving a high transmittance for a specific wavelength laser emitted by the VCSEL array in a longitudinal direction.

As a further improvement of the present invention, the highly doped semiconductor transparent material injected in the vortex optical waveguide structure can adjust a specific refractive index according to needs, so that the vortex optical waveguide structure generates a photon forbidden band region, thereby changing an effective refractive index of a TE mode and a TM mode, at a same propagation distance, the mode walks away due to different propagation constants, thereby modulating the higher-order mode of the Laguerre-Gaussian beam, so that a HE mode and an EH mode which stably generate a near-diffraction-limited vortex beam can be formed, and through the combination of highly doped semiconductor transparent material and vortex optical waveguide structure, a longitudinal high-efficiency transmission of the optical field and a transverse high-order mode conversion are realized, and beam quality and optical power of the array output are improved;

As a further improvement of the present invention, the highly doped semiconductor transparent material improves a thermal conductivity of the material by doping high thermal conductivity elements, so that the material has better thermal conductivity, with the help of this material to replace the traditional metal-type P electrode, a transverse heat conduction area of the chip is further improved. By filling the semiconductor transparent material into the vortex optical waveguide structure, the heat generated in the active region can be quickly exported directly through the highly doped semiconductor transparent medium in a longitudinal heat conduction, which reduces the influence of P-DBR with poor thermal conductivity and improves the longitudinal heat conduction performance. And through the combination of highly doped semiconductor transparent material and vortex optical waveguide structure, a longitudinal heat transfer and a transverse heat dissipation are realized, a capacity of array heat dissipation is improved, and a power consumption of the device is reduced.

As a further improvement of the present invention, an undoped material of the highly doped semiconductor transparent materials includes one of zinc selenide, cadmium selenide, indium zinc selenide, indium selenide and silicon.

As a further improvement of the present invention, a doped material of the highly doped semiconductor transparent materials includes one of aluminum, copper, silver, boron nitride and diamond, and a doped element and a composition ratio can be adjusted according to actual needs.

As a further improvement of the present invention, a preparation method for micro/nanostructures pores includes one of a lithography method, an electron beam lithography method, an ion beam etching method, an inductively coupled plasma etching method and a laser interference lithography method.

As a further improvement of the present invention, a fabrication method for the highly doped semiconductor transparent materials includes one of an ion implantation method, a molecular beam epitaxy method, a chemical vapor deposition method, and a physical vapor deposition method.

As a further improvement of the present invention, a method for filling the micro/nanostructures pores with the highly doped semiconductor transparent materials includes one of a sputtering method, an ion implantation method, a metal-organic compound chemical vapor deposition method, and an atomic layer deposition method.

Compared with the existing technology, the beneficial effects of the present invention are:

on the basis of VCSEL array, the present invention etches a certain optical arrangement of micro/nanostructures pores on the DBR surface at the light output aperture of each light-emitting unit, and has a highly doped semiconductor transparent material inside the etched pores and on the surface of the light output area to realize the vortex optical waveguide structure; in terms of optics, it is beneficial to realize the optical interconnection of the transverse optical field of the VCSEL array and the longitudinal high-power fundamental mode vortex beam output; in terms of electricity, it is beneficial to realize the large-area and large-current transverse supply current of the high-power large VCSEL array and make the current to longitudinally penetrated device P-type DBR to realize the direct supply current to the active region, which increases the electrode area of the P side, reduces the resistance of the P-type DBR, and reduces the Joule heat; in terms of heat, the doped of high thermal conductivity materials in highly doped semiconductor transparent materials not only helps to reduce the thermal resistance of the device itself, avoids the influence of poor heat dissipation of P-type DBR, but also improves the thermal conductivity of the device itself, making the longitudinal heat dissipation performance better; based on this, the beam quality and power of large VCSEL array are greatly improved, and the fundamental mode vortex beam output with high-power and high-coherence is realized.

In the figures:
1, a substrate layer; 2, an N-type DBR layer; 3, a semiconductor multi-quantum well layer; 4, an oxidation confinement layer; 5, a P-type DBR layer; 6, a passivation layer; 7, a P electrode layer; 8, a vortex optical waveguide structure; 9, an N electrode layer.

DETAILED DESCRIPTION OF THE EMBODIMENTS

In order to make the objectives, the technical solutions, and the advantages of the present invention clearer, the following clearly and completely describes the technical solutions in embodiments of the present invention with reference to the drawings in the embodiments of the present invention. Apparently, the described embodiments are only some but not all of the embodiments of the present invention. All other embodiments obtained by those of ordinary skill in the art based on the embodiments of the present invention without involving any creative effort shall fall within the scope of protection of the present invention.

Figure 1:
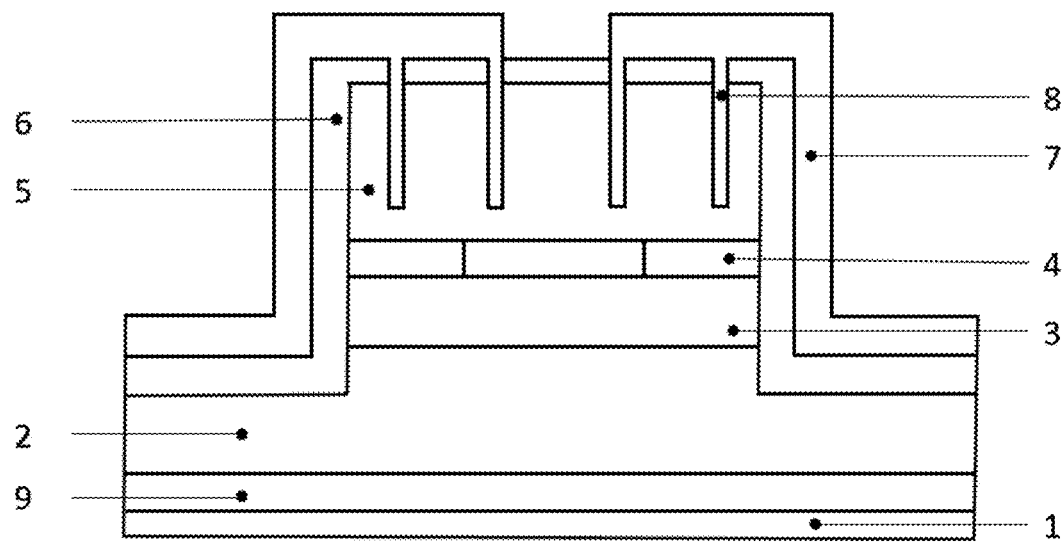
FIG. 1 is a schematic diagram of the structure of a high-power large-aperture fundamental mode vortex optical waveguide coherent VCSEL array by an embodiment of the present invention.
Figure 2:
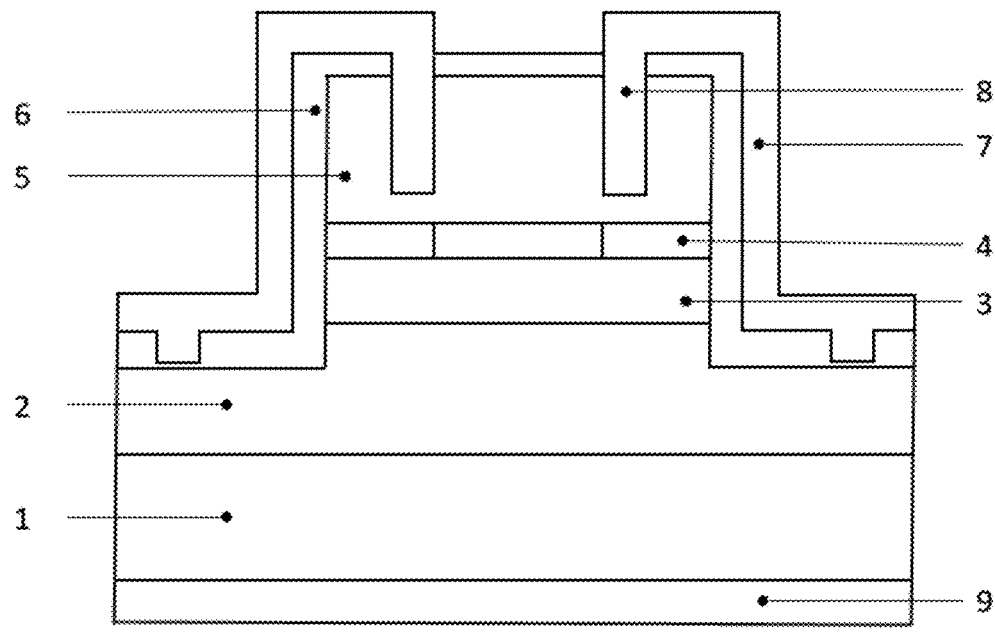
FIG. 2 is a schematic diagram of the structure of a high-power large-aperture fundamental mode vortex optical waveguide coherent VCSEL array by another embodiment of the present invention.

The present invention will be further described in detail below with reference to the accompanying drawings:

the present invention provides a high-power large-aperture fundamental mode vortex optical waveguide coherent VCSEL array, the coherent VCSEL array is a large-aperture array light-emitting structure, including an N electrode layer, an N-type DBR, an active region, an P-type DBR and a P electrode layer; micro/nanostructures pores with hexagonal close packing arrangement are etched on the surface of the light output aperture on the each light-emitting unit mesa of the coherent VCSEL array, the micro/nanostructures pores are filled with highly doped semiconductor transparent materials to form an inner ring vortex optical waveguide structure, that is, a fundamental mode vortex optical waveguide photonic band gap structure, as shown in FIG. 1; at the same time, further, the micro/nanostructures pores with hexagonal close packing arrangement are etched under mesa surface of each light-emitting unit of the coherent VCSEL array, the micro/nanostructures pores are filled with highly doped semiconductor transparent materials to form an outer ring vortex optical waveguide structure; as shown in FIG. 2. The present invention changes the photon-forbidden band in the optical waveguide structure by changing the equivalent refractive index in the micro/nanostructures, so that the adjacent light-emitting units can form the mutual exchange of optical fields by means of the point defects in the vortex optical waveguide structure, and realize the transverse optical interconnection of the two-dimensional VCSEL array; at the same time, the vortex optical waveguide structure can perform transverse optical field modulation and shaping of the light emitted by a single large-aperture VCSEL, so that the high-order Laguerre-Gaussian optical field emitted by each unit is converted into vortex beam, finally, the whole light-emitting unit of the VCSEL array becomes a two-dimensional optical waveguide array, becoming a integral high-coherent emitting high-power large-aperture fundamental mode VCSEL array. The semiconductor transparent material of the present invention also replaces the metal as the P electrode layer, the structure can improve the transverse transmission and longitudinal injection efficiency of the current; at the same time, the high thermal conductivity material doped in the highly doped semiconductor transparent material can improve the longitudinal thermal conductivity and heat dissipation of the device, the Gaussian beam in the vertical direction is shaped and the optical field of the adjacent light-emitting units in the horizontal direction is exchanged by the vortex optical waveguide structure to achieve stable high-coherence high-power fundamental mode vortex beam output; on the basis of VCSEL array, the structure of the present invention can solve the problems of chaotic output mode, low power, serious heating and poor heat dissipation performance of traditional VCSEL array laser.

Figure 3A:
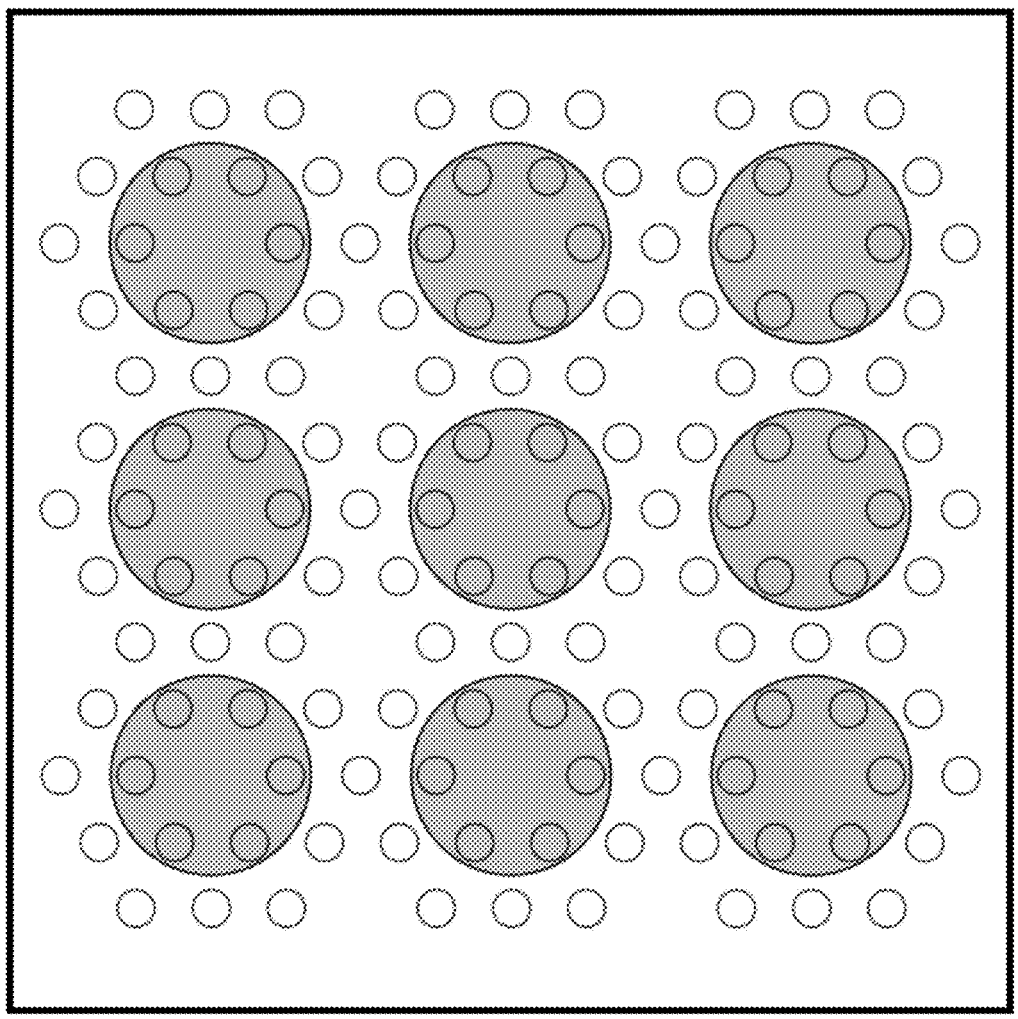
FIG. 3A is a top view schematic diagram of the structure of a high-power large-aperture fundamental mode vortex optical waveguide coherent VCSEL array of a 3×3 square array disclosed by the present invention.

Embodiment 1 as shown in FIG. 2 and FIG. 3A, the present invention provides a high-power large-aperture fundamental mode vortex optical waveguide coherent VCSEL array in a square arrangement and preparation method thereof, including: a substrate layer 1, an N-type DBR layer 2, a semiconductor multi-quantum well layer 3, an oxidation confinement layer 4, a P-type DBR layer 5, a passivation layer 6, a P electrode layer 7, a vortex optical waveguide structure 8, and an N electrode layer 9; wherein:

in the embodiment, the number of light sources of the vertical-cavity surface-emitting laser array is 9, forming a 3×3 square arrangement, the distance between the two adjacent lasers is 32 μm, the diameter of the light output aperture is 20 μm, the mesa diameter of the light-emitting unit is 22 μm, and the size of the whole array is 100 μm×100 μm, this array is a large-aperture light-emitting structure, which is used to generate a spatially periodically distributed optical field. Inductively coupled plasma etching technology is used to deeply etch the vortex optical waveguide structure 8 with the first cycle hexagonal close packing arrangement on the light-emitting surface of the light-emitting sub-unit of the surface-emitting semiconductor laser, the etching position is 2 m away from the edge of the mesa, the etching depth is 500 nm, and the etching pore diameter is 3 m. The vortex optical waveguide structure 8 with the second cycle hexagonal close packing arrangement is shallowly etched under the mesa of the light-emitting sub-unit, the etching position is 2 m away from the edge of the mesa, and the etching depth is 1.5 m. The edge distance between two adjacent light-emitting sub-unit mesas is 7 μm, and the middle contains one or more vortex optical waveguide structures 8.

Magnetron sputtering technology is used to the etched epitaxial wafer, the vortex optical waveguide structure 8 is filled with undoped semiconductor transparent material; because the vortex optical waveguide structure has different etching depths at different positions, the semiconductor transparent material can be injected into the vortex optical waveguide structure 8 by multi-step lithography, magnetron sputtering and stripping, and finally sputtered on the array surface to form a P electrode layer 7.

A certain concentration of doped elements at a certain depth is introduced into the undoped semiconductor transparent material by the ion implantation method. The doped material includes but are not limited to one of aluminum, copper, silver, boron nitride and diamond; taking aluminum as an example, aluminum compounds (such as $AlCl_3$ or $Al_2O_3$) are selected as a doped source. The impurity ions required by the ion source heating source material are directionally injected into the material after being charged by the ion acceleration system to form a highly doped semiconductor transparent material with high conductivity and high thermal conductivity.

In the embodiment, the micro/nanostructures pores with hexagonal close packing arrangement are fabricated by lithography technology, that is, the pores of vortex optical waveguide structure 8; for highly doped semiconductor transparent materials with high conductivity and high thermal conductivity, the method of filling by magnetron sputtering first and then doping by ion implantation is adopted to fabricate them; the micro/nanostructures pores in the hexagonal lattice arrangement are combined with the highly doped semiconductor transparent material to form the vortex optical waveguide structure 8, the vortex optical waveguide structure with the first cycle hexagonal close packing arrangement is deeply etched on the light-emitting surface of the light-emitting sub-unit, and its depth-width etching ratio is 1:1; the etching depth is close to the active region layer, which can be combined with the vortex optical waveguide structure of the second cycle hexagonal close packing arrangement, and the beam restriction and modulation can be performed on the large-aperture light-emitting structure with chaotic modes; it can also be combined with the high-doped semiconductor material sputtered on the whole surface of the P electrode surface to carry a large current longitudinally injected into the active region, and can also be combined with the high-doped semiconductor material sputtered on the whole surface of the P electrode surface to carry heat to transfer out of the active area for efficient heat dissipation. There is the vortex optical waveguide structure with the second cycle hexagonal close packing arrangement between adjacent light-emitting units, because it does not need to carry large current and heat dissipation functions, it is filled with shallow etching. The change of the equivalent refractive index of the vortex optical waveguide structure arranged in the first and second cycles of hexagonal lattice arrangement after filling makes the photon forbidden band in the optical waveguide structure change, which can make the adjacent light-emitting units form the mutual exchange of optical fields by means of the point defects in the vortex optical waveguide structure, and realize the transverse optical interconnection of the two-dimensional VCSEL array.

Figure 4:
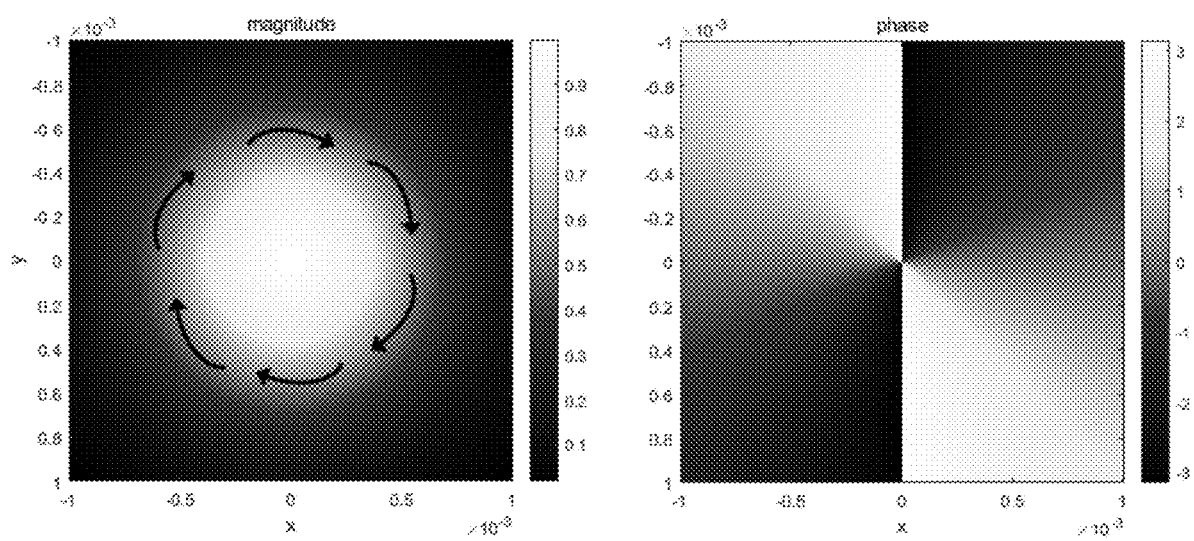
FIG. 4 is a schematic diagram of a vortex optical amplitude and phase simulation of a high-power large-aperture fundamental mode vortex optical waveguide coherent VCSEL array of the 3×3 square array disclosed by the present invention.
Figure 5:
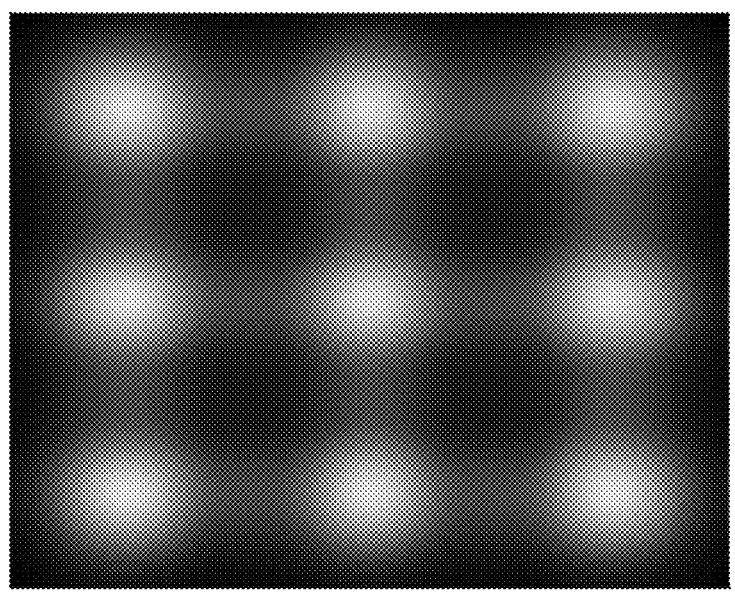
FIG. 5 is a schematic diagram of a transverse optical interconnection simulation of a high-power large-aperture fundamental mode vortex optical waveguide coherent VCSEL array of the 3×3 square array disclosed by the present invention.

The vortex optical amplitude and phase simulation of the coherent VCSEL array in embodiment 1, as shown in FIG. 4; the transverse optical interconnection simulation of coherent VCSEL arrays, as shown in FIG. 5.

Figure 3B:
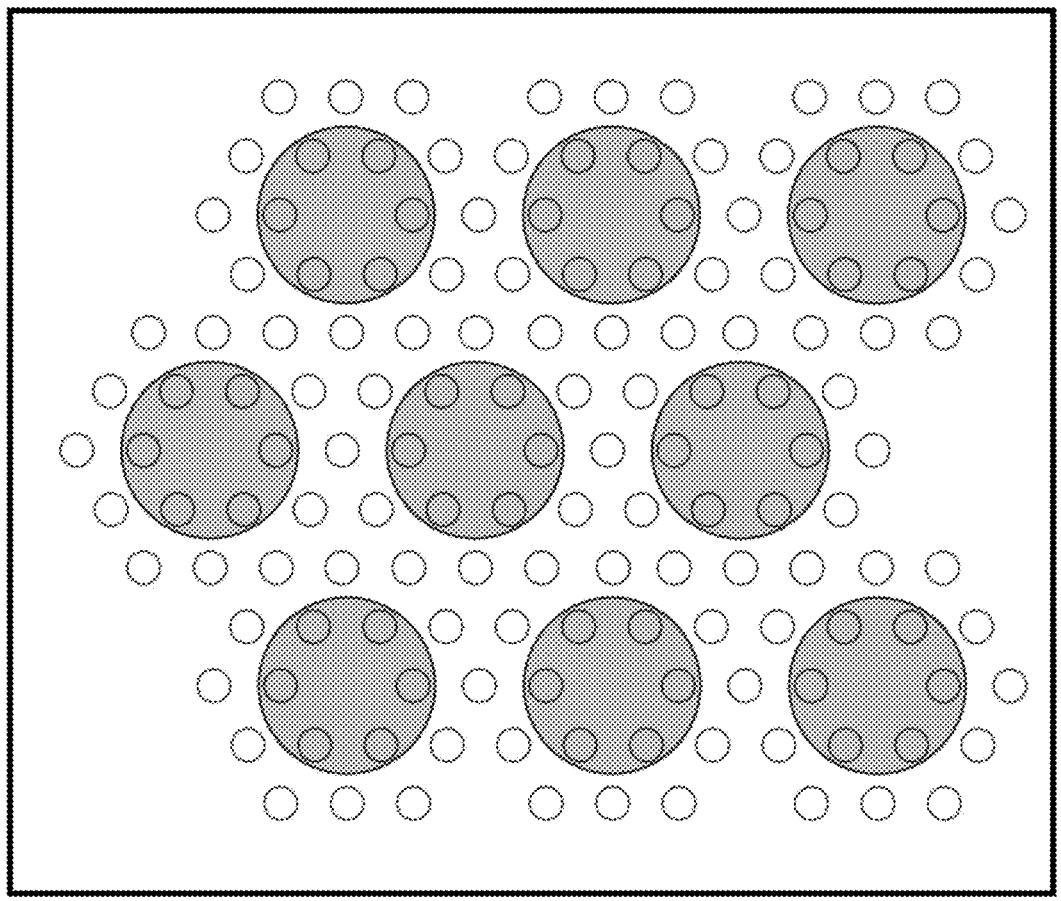
FIG. 3B is a top view schematic diagram of the structure of a high-power large-aperture fundamental mode vortex optical waveguide coherent VCSEL array of a 3×3 hexagonal array disclosed by the present invention.

Embodiment 2 as shown in FIG. 2 and FIG. 3B, the present invention provides a high-power large-aperture fundamental mode vortex optical waveguide coherent VCSEL array in a hexagonally arrangement and preparation method thereof, including: a substrate layer 1, an N-type DBR layer 2, a semiconductor multi-quantum well layer 3, an oxidation confinement layer 4, a P-type DBR layer 5, a passivation layer 6, a P electrode layer 7, a vortex optical waveguide structure 8, and an N electrode layer 9; wherein:

in the embodiment, the number of light sources of the vertical-cavity surface-emitting laser array is 9, forming a 3×3 hexagonal arrangement, the distance between the two adjacent lasers is 32 μm, the diameter of the light output aperture is 20 μm, the mesa diameter of the light-emitting unit is 22 μm, and the size of the whole array is 150 μm×150 μm, this array is a large-aperture light-emitting structure, which is used to generate a spatially periodically distributed optical field. Inductively coupled plasma etching technology is used to deeply etch the vortex optical waveguide structure 8 with the first cycle hexagonal close packing arrangement on the light-emitting surface of the light-emitting sub-unit of the surface-emitting semiconductor laser, the etching position is 2 m away from the edge of the mesa, the etching depth is 3 μm, and the etching pore diameter is 3 m. The vortex optical waveguide structure 8 with the second cycle hexagonal close packing arrangement is shallowly etched under the mesa of the light-emitting sub-unit, the etching position is 2 m away from the edge of the mesa, and the etching depth is 500 nm. The edge distance between two adjacent light-emitting sub-unit mesas is 7 μm, and the middle contains one or more vortex optical waveguide structures.

The vortex optical waveguide structure is formed by etching GaAs using an electron beam lithography device and an inductively coupled plasma technology; because the etching depth of the vortex optical waveguide structure is different at different positions, the depth can be etched separately, and the vortex optical waveguide structure can be fabricated by a two-step etching method.

Highly doped semiconductor transparent materials are fabricated by a metal-organic compound chemical vapor deposition method, and high conductivity and high thermal conductivity elements are introduced into undoped semiconductor materials. The metal to be doped is mixed in the precursor solution in the form of ions, and the solution is introduced into the chamber in the form of a spray, at the same time, the undoped semiconductor transparent material is made into a sheet as the substrate material, and the highly doped semiconductor transparent material is fabricated by heating and other reaction conditions;

Magnetron sputtering technology is used for the etched epitaxial wafer, the vortex optical waveguide structure is filled with undoped semiconductor transparent material; the highly doped semiconductor transparent material prepared in the above step is used as the target material, and the highly doped semiconductor transparent material is injected into the vortex optical waveguide structure by multiple magnetron sputtering, and finally sputtered on the array surface to form a P electrode.

In the embodiment, the hexagonal array structure is more compact and the light distribution is more uniform than the square arrangement; the micro/nanostructures pores with hexagonal close packing arrangement are fabricated by electron beam lithography technology; for highly doped semiconductor transparent materials, the method of doping by metal organic compound chemical vapor deposition method first and then filling by magnetron sputtering is adopted to fabricate them; the micro/nanostructures pores with the hexagonal lattice arrangement are combined with the highly doped semiconductor transparent material to form the vortex optical waveguide structure 8, the vortex optical waveguide structure with the first cycle hexagonal close packing arrangement is deeply etched on the light-emitting surface of the light-emitting sub-unit, and its depth-width etching ratio is 1:1, the etching depth is close to the active region layer, which can be combined with the vortex optical waveguide structure of the second cycle hexagonal close packing arrangement, and the beam restriction and modulation can be performed on the large-aperture light-emitting structure with chaotic modes; it can also be combined with the high-doped semiconductor material sputtered on the whole surface of the P electrode surface to carry a large current longitudinally injected into the active region, and can also be combined with the high-doped semiconductor material sputtered on the whole surface of the P electrode surface to carry heat to transfer out of the active area for efficient heat dissipation. There is the vortex optical waveguide structure with the second cycle hexagonal close packing arrangement between adjacent light-emitting units, because it does not need to carry large current and heat dissipation functions, it is filled with shallow etching. The change of the equivalent refractive index of the vortex optical waveguide structure arranged in the first and second cycles of hexagonal close packing arrangement after filling makes the photon forbidden band in the optical waveguide structure change, which can make the adjacent light-emitting units form the mutual exchange of optical fields by means of the point defects in the vortex optical waveguide structure, and realize the transverse optical interconnection of the two-dimensional VCSEL array.

The advantages of the present invention are:

the present invention combines the vortex optical waveguide structure and the P electrode layer in the traditional VCSEL array laser to realize the transverse and longitudinal regulation of the optical waveguide, the transverse and longitudinal injection of the current and the transverse and longitudinal conduction of the heat, and finally realizes the large-aperture high-power and high-coherence fundamental mode VCSEL array, solves the problems of low power, poor beam quality, excessive P-type DBR electric resistance and thermal resistance, and serious array heat accumulation of the traditional VCSEL array.

The above embodiments are merely preferred embodiments of the present invention, but are not intended to limit the present invention, for those skilled in the art, the invention can have various changes and variations. And any modifications, equivalent replacements, improvements, etc. made within the spirit and principles of the disclosure should fall within the scope of protection of the present invention.

What is claimed is:

1. A high-power large-aperture fundamental mode vortex optical waveguide coherent vertical-cavity surface-emitting laser (VCSEL) array, being a large-aperture array light-emitting structured and comprising an N electrode layer, an N-type distributed Bragg reflector (DBR), an active region, a P-type DBR, and a P electrode layer; wherein micro/nanostructures pores with a hexagonal lattice arrangement are etched on a surface of a light output aperture on each light-emitting unit mesa of the coherent VCSEL array, the micro/nanostructures pores are filled with highly doped semiconductor transparent materials to form a vortex optical waveguide structure;

the micro/nanostructures pores with the hexagonal lattice arrangement are etched on a mesa surface and under a mesa surface of each light-emitting unit of the coherent VCSEL array, wherein a light emitted by a single large-aperture VCSEL performs transverse optical field modulation and shaping, making a high-order Laguerre-Gaussian optical field emitted by each light-emitting unit is converted into a vortex beam, wherein adjacent light-emitting units are allowed to form a mutual exchange of optical fields, and a transverse optical interconnection of a two-dimensional VCSEL array is realized;

micro/nanostructures pores of an inner ring and micro/nanostructures pores of an outer ring are coaxially arranged with the light output aperture of the light-emitting unit, and an etching depth of the micro/nanostructures pores of the inner ring is greater than an etching depth of the micro/nanostructures pores of the outer ring.

2. The high-power large-aperture fundamental mode vortex optical waveguide coherent VCSEL array according to claim 1, wherein an arrangement of the light-emitting units of the coherent VCSEL array comprises one of a hexagonal array arrangement, a square array arrangement, and a ring array arrangement.

3. The high-power large-aperture fundamental mode vortex optical waveguide coherent VCSEL array according to claim 1, wherein the highly doped semiconductor transparent material of the vortex optical waveguide structure has a high selective transmittance for a near-infrared wavelength light emitted by the coherent VCSEL array, and composition and density of the highly doped semiconductor transparent material are allowed to be adjusted according to actual needs to form an internal and external refractive index difference; the vortex optical waveguide structure is allowed to adjust an overall refractive index distribution of the vortex optical waveguide structure, induce to generate a phase term, and form a mode converter, wherein a high-order Laguerre-Gaussian beam is shaped, modulated, and converted into a near-diffraction-limited vortex beam.

4. The high-power large-aperture fundamental mode vortex optical waveguide coherent VCSEL array according to claim 1, wherein the highly doped semiconductor transparent material of the vortex optical waveguide structure is doped to improve conductivity and thermal conductivity of the vortex optical waveguide structure, a first part is injected into pores of the vortex optical waveguide structure, and a second part is distributed on a surface of a light output area of the coherent VCSEL array to form a predetermined electrical contact with a P-type DBR layer of the coherent VCSEL array.

5. The high-power large-aperture fundamental mode vortex optical waveguide coherent VCSEL array according to claim 4, wherein an undoped material of the highly doped semiconductor transparent materials comprises one of zinc selenide, cadmium selenide, indium zinc selenide, indium selenide, and silicon; a doped material comprises one of aluminum, copper, silver, boron nitride, and diamond.

6. The high-power large-aperture fundamental mode vortex optical waveguide coherent VCSEL array according to claim 1, wherein a preparation method for the micro/nanostructures pores comprises one of a lithography method, an electron beam lithography method, an ion beam etching method, an inductively coupled plasma etching method, and a laser interference lithography method.

7. The high-power large-aperture fundamental mode vortex optical waveguide coherent VCSEL array according to claim 1, wherein a fabrication method for the highly doped semiconductor transparent materials comprises one of an ion implantation method, a molecular beam epitaxy method, a chemical vapor deposition method, and a physical vapor deposition method.

8. The high-power large-aperture fundamental mode vortex optical waveguide coherent VCSEL array according to claim 1, wherein a method for filling the micro/nanostructures pores with the highly doped semiconductor transparent materials comprises one of a sputtering method, an ion implantation method, a metal-organic compound chemical vapor deposition method, and an atomic layer deposition method.

\* \* \* \* \*

UNITED STATES PATENT AND TRADEMARK OFFICE
CERTIFICATE OF CORRECTION

| | | |
|---|---|---|
| PATENT NO. | : 12,322,929 B1 | Page 1 of 1 |
| APPLICATION NO. | : 18/884137 | |
| DATED | : June 3, 2025 | |
| INVENTOR(S) | : Jingjing Dai et al. | |

It is certified that error appears in the above-identified patent and that said Letters Patent is hereby corrected as shown below:

On the Title Page

Item (30) Foreign Application Priority Data should read:
Dec. 05, 2023 (CN) ……………..202311653123.0

Signed and Sealed this
Fifth Day of August, 2025

Coke Morgan Stewart
*Acting Director of the United States Patent and Trademark Office*